(12) United States Patent
Sakakibara (10) Patent No.: US 9,042,182 B2
(45) Date of Patent: May 26, 2015

(54) NONVOLATILE SEMICONDUCTOR MEMORY DEVICE AND VERIFICATION CONTROL METHOD FOR THE SAME

(71) Applicant: FUJITSU SEMICONDUCTOR LIMITED, Yokohama, Kanagawa (JP)

(72) Inventor: Mitsuharu Sakakibara, Tachikawa (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 280 days.

(21) Appl. No.: 13/662,107

(22) Filed: Oct. 26, 2012

(65) Prior Publication Data

US 2013/0176791 A1    Jul. 11, 2013

(30) Foreign Application Priority Data

Nov. 18, 2011    (JP) .................................. 2011-252435

(51) Int. Cl.
*G11C 16/06* (2006.01)
*G11C 16/34* (2006.01)
*G11C 16/08* (2006.01)
*G11C 16/26* (2006.01)

(52) U.S. Cl.
CPC ............ *G11C 16/3459* (2013.01); *G11C 16/08* (2013.01); *G11C 16/26* (2013.01); *G11C 16/3445* (2013.01)

(58) Field of Classification Search
USPC ............ 365/185.21, 185.22, 185.13, 189.05, 365/205, 189.15, 207
See application file for complete search history.

(56) References Cited

U.S. PATENT DOCUMENTS

| | | | |
|---|---|---|---|
| 5,446,690 A | 8/1995 | Tanaka et al. | |
| 6,081,452 A | 6/2000 | Ohta | |
| 6,643,182 B2 * | 11/2003 | Yanagisawa et al. | 365/185.24 |
| 2007/0147128 A1 * | 6/2007 | Edahiro | 365/185.21 |

FOREIGN PATENT DOCUMENTS

| | | |
|---|---|---|
| JP | 03-259499 A | 11/1991 |
| JP | 07-057482 A | 3/1995 |
| JP | 10-228785 A | 8/1998 |
| JP | 10-241378 A | 9/1998 |

* cited by examiner

*Primary Examiner* — Thao H Bui
(74) *Attorney, Agent, or Firm* — Arent Fox LLP (57) ABSTRACT

A nonvolatile semiconductor memory device includes a memory cell array, a plurality of local sense amplifiers, a global sense amplifier and an address decoder. The address decoder is configured to switch between a first verification and a second verification. The first verification operates the plurality of local sense amplifiers and simultaneously verifies data of a plurality of memory cells connected to the plurality of local sense amplifiers. The second verification stops the plurality of local sense amplifiers, directly connects the local bit line connected to each of the local sense amplifiers with the global bit line, and simultaneously verifies data of the plurality of memory cells connected to the plurality of local sense amplifiers.

11 Claims, 11 Drawing Sheets

DETERMINING CIRCUIT
(VERIFICATION DATA DETERMINING UNIT 5)

FIG.6

DETERMINING CIRCUIT
(VERIFICATION DATA DETERMINING UNIT 5)

DETERMINING CIRCUIT
(VERIFICATION DATA DETERMINING UNIT 5)

FIG.11

NONVOLATILE SEMICONDUCTOR MEMORY DEVICE AND VERIFICATION CONTROL METHOD FOR THE SAME

CROSS REFERENCE TO RELATED APPLICATION

This application is based upon and claims the benefit of priority of the prior Japanese Patent Application No. 2011-252435, filed on Nov. 18, 2011, the entire contents of which are incorporated herein by reference.

FIELD

The embodiments discussed herein are related to a nonvolatile semiconductor memory device and verification control method for the same.

BACKGROUND

In a memory cell of a nonvolatile semiconductor memory device such as a flash memory (flash $E^2PROM$), threshold voltage of a transistor as a component of the memory cell changes between a data erasure state and a data non-erasure state.

Usually, for example, when data is erased in a memory cell in a flash memory which is used, the threshold voltage becomes low and cell current increases. Consequently, when erasure advances in even one memory cell, current in an entire memory cell array largely flows.

That is, in a general flash memory, in batch verification of performing wired-OR operation on bit lines of all of memory cells, for example, if even one memory cell in the erasure state exists, the potential of the bit line is decreased to the level of a low-potential power supply line. Consequently, it is difficult to detect that all of memory cells are erased in a lump.

As a result, in a flash memory using a memory cell whose threshold voltage becomes low when data is erased, erase verification is performed address by address like in the reading operation.

In a nonvolatile semiconductor device such as a flash memory (flash $E^2PROM$) using, for example, a memory cell whose threshold voltage becomes low when data is erased, even when batch erasure is executed on a plurality of sectors, verification time is long. Consequently, there is a problem such that the effect of the batch erasure is reduced.

For example, a nonvolatile semiconductor memory device including large storage capacity may have a problem to be solved such that verification time is unignorably long.

In the related art, there have been proposed various kinds of verification techniques for a nonvolatile semiconductor memory device.

Patent Document 1: Japanese Laid-open Patent Publication No. H03-259499
Patent Document 2: Japanese Laid-open Patent Publication No. H10-241378
Patent Document 3: Japanese Laid-open Patent Publication No. H10-228785
Patent Document 4: Japanese Laid-open Patent Publication No. H07-057482

SUMMARY

According to an aspect of the embodiments, there is provided a nonvolatile semiconductor memory device comprising a memory cell array, a plurality of local sense amplifiers, a global sense amplifier, and an address decoder.

The memory cell array includes a plurality of electrically-rewritable memory cells each connected to a word line and a local bit line. The plurality of local sense amplifiers, which are connected to the local bit lines, are configured to invert data of the memory cells, respectively, and to output the inverted data to a global bit line.

The global sense amplifier is configured to compute logical sum of outputs of the plurality of local sense amplifiers, and the address decoder is configured to switch between a first verification and a second verification.

The first verification operates the plurality of local sense amplifiers and simultaneously verifies data of a plurality of memory cells connected to the plurality of local sense amplifiers.

The second verification stops the plurality of local sense amplifiers, directly connects the local bit line connected to each of the local sense amplifiers with the global bit line, and simultaneously verifies data of the plurality of memory cells connected to the plurality of local sense amplifiers.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Before describing the embodiments of a nonvolatile semiconductor memory device and a verification control method for the same, a nonvolatile semiconductor memory device and a verification control method for the same in a related art and problems in them will be described with reference to FIG. 1 to FIG. 5.

Figure 1:
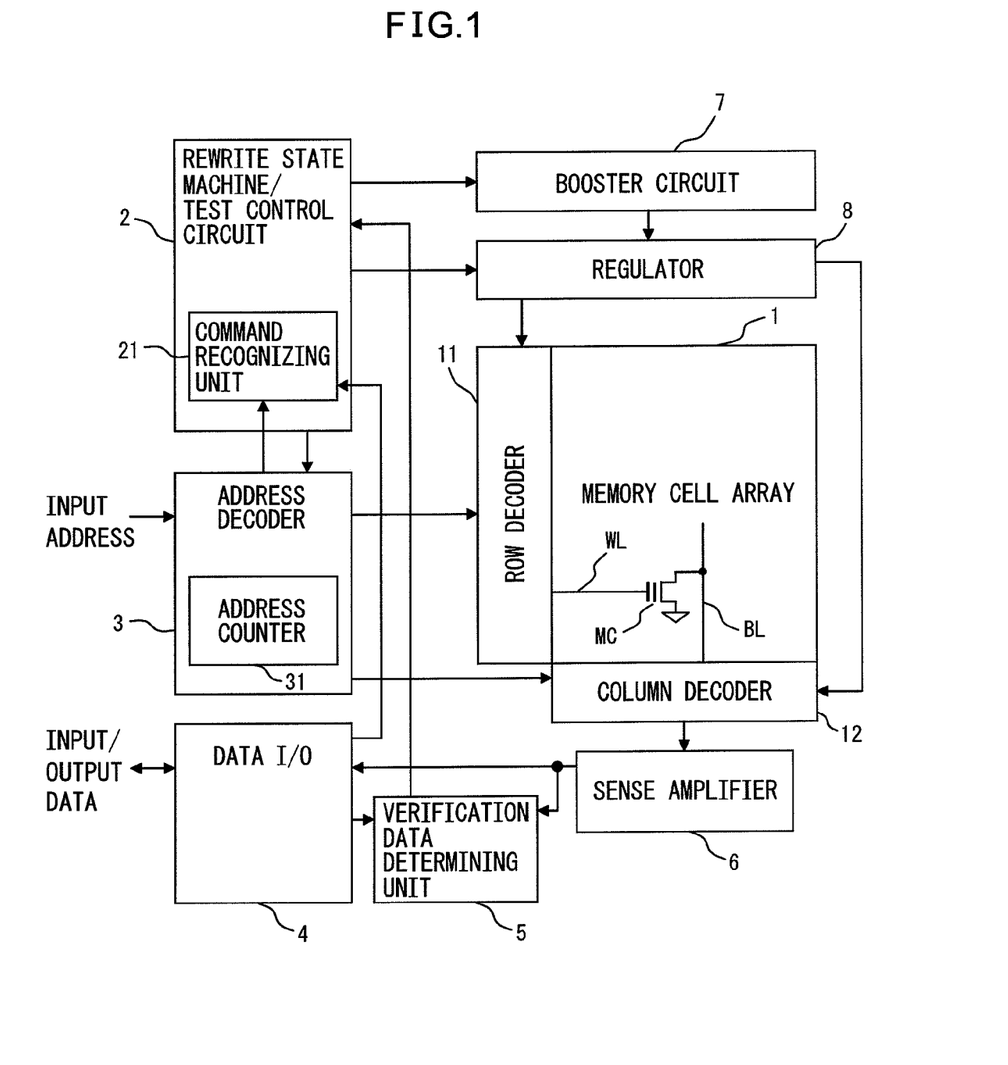
FIG. 1 is a block diagram illustrating an example of a nonvolatile semiconductor memory device.

FIG. 1 is a block diagram illustrating an example of a nonvolatile semiconductor memory device and illustrates an example of a flash memory having therein an automatic rewriting algorithm. As illustrated in FIG. 1, a flash memory has a memory cell array 1, a rewriting state machine/test control circuit 2, an address decoder 3, and a data input/output (I/O) circuit 4.

The flash memory also has a verification data determining unit 5, a sense amplifier 6, a booster circuit 7, and a regulator 8. The memory cell array 1 includes a plurality of memory cells MC provided at crossing points of a plurality of word lines WL and a plurality of bit lines BL.

Specifically, each memory cell MC has a gate (control gate) connected to the word line WL, a drain connected to the bit line BL, and a source connected to the ground (to a low-potential power supply line level Vss).

The word line WL is selected according to a row address supplied from the address decoder 3 by a row decoder 11, and the bit line BL is connected to the sense amplifier 6 via a column decoder 12 in accordance with a column address from the address decoder 3.

The rewriting state machine/test control circuit 2 has a command recognizing unit 21, for example, recognizes a rewrite command from the outside, and performs rewriting (programming) of the memory cell MC in the memory cell array 1.

The address decoder 3 has an address counter 31, outputs a row address and a column address corresponding to an input address, and generates and outputs an address obtained by counting by the address counter 31.

The verification data determining unit 5 receives an output of the data I/O circuit 4 and an output of the sense amplifier 6, performs write verification (program verification) and erase verification, and outputs the results to the rewrite state machine/test control circuit 2.

For example, at the time of programming of the memory cell MC, the program verification is performed. The voltage of the word line WL at the time of verification is generated by the booster circuit 7 and the regulator 8 and data is read by the sense amplifier 6 in a manner similar to normal reading operation.

In the flash memory illustrated in FIG. 1, erasing and programming is performed by inputting a command of combination of an address and data or starting a test mode and controlling the address and the voltage by the address counter 31 and the circuit 2.

The nonvolatile semiconductor memory device and the verification control method for the same of the embodiment which will be described specifically later may be applied to the flash memory having the configuration of FIG. 1.

Figure 2:
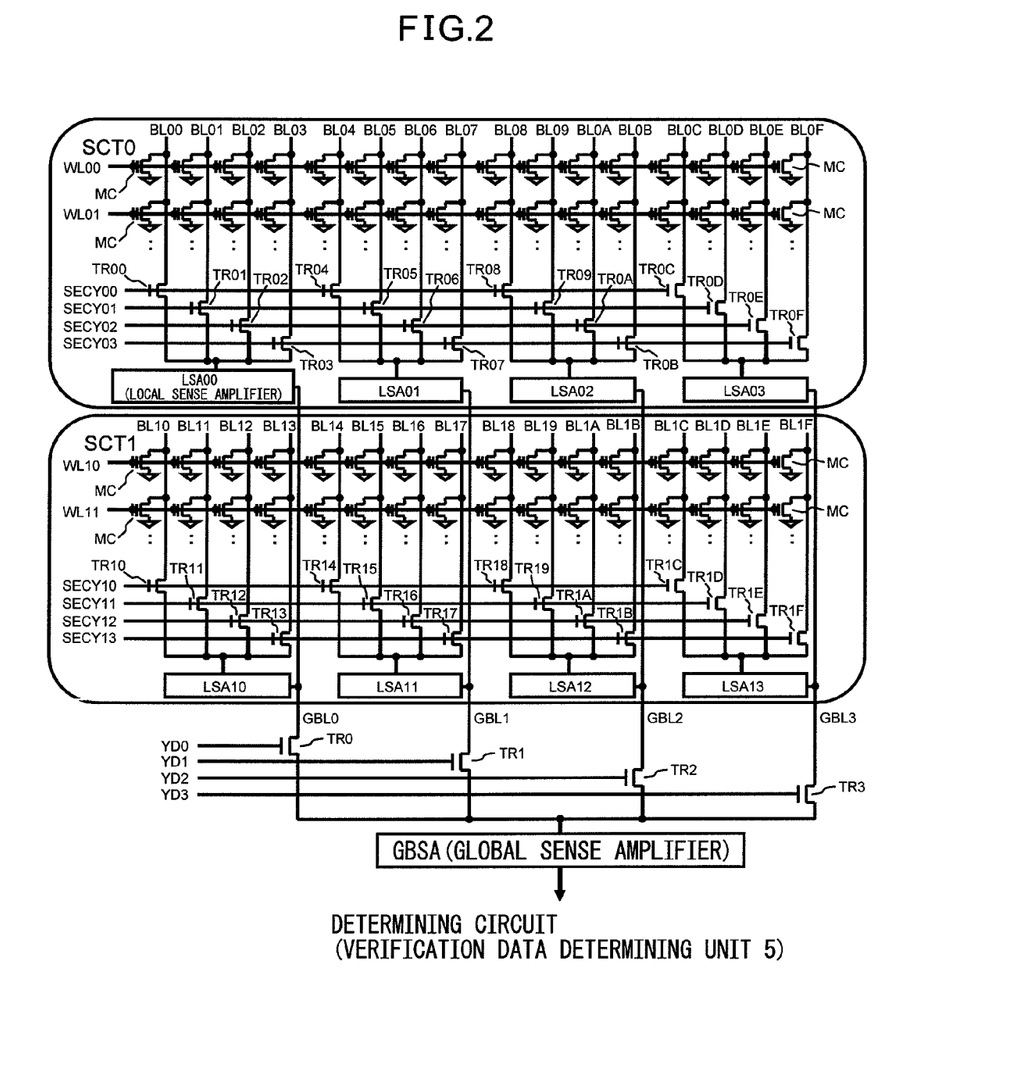
FIG. 2 is a diagram schematically illustrating a main part of the nonvolatile semiconductor memory device illustrated in FIG. 1.

FIG. 2 is a diagram schematically illustrating a main part of the nonvolatile semiconductor memory device illustrated in FIG. 1 and illustrates a configuration corresponding to the memory cell array 1, the column decoder 12, and the sense amplifier 6 and for outputting data of the memory cell MC to a determining circuit (verification data determining unit 5).

In the example of FIG. 2, the memory cell array 1 is divided into sectors (SCT0 and SCT1) as erasure units, and a local bit line BLxx in each of the sectors is connected to the local sense amplifier via a switch element selected by a selection signal SECYxx.

Further, one local sense amplifier is provided for four local bit lines. For four global bit lines to which outputs of the local sense amplifiers of the sectors are connected, a global sense amplifier is connected via switch elements selected by a selection signal YDx.

Concretely, in the sector SCT0, local bit lines BL00 to BL03 are connected to a local sense amplifier LSA00 via switching transistors T00 to TR03 selected by selection signals SECY00 to SECY03.

In the sector SCT0, local bit lines BL0C to BL0F are connected to a local sense amplifier LSA03 via switching transistors TR0C to TR0F selected by the selection signals SECY00 to SECY03.

Further, in the sector SCT1, local bit lines BL10 to BL13 are connected to a local sense amplifier LSA10 via switching transistors TR10 to TR13 selected by selection signals SECY10 to SECY13.

In the sector SCT1, local bit lines BL1C to BL1F are connected to a local sense amplifier LSA13 via switching transistors TR1C to TR1F selected by the selection signals SECY10 to SECY13.

A global bit line GBL0 is connected to an output of the local sense amplifier LSA00 of the sector SCT0 and an output of the local sense amplifier LSA10 of the sector SCT1.

A global bit line GBL3 is connected to an output of the local sense amplifier LSA03 of the sector SCT0 and an output of the local sense amplifier LSA13 of the sector SCT1.

Four global bit lines GBL0 to GBL3 are connected to a global sense amplifier GBSA via switching transistors TR0 to TR3 selected by selection signals YD0 to YD3.

In FIG. 2, the number of sectors is set to two (SCT0 and SCT1) and the number of bit lines included in each sector is set to 16 (BL00 to BL0F and BL10 to BL1F). Further, local sense amplifiers (LSA00 and LSA10, . . . , and LSA03 and LSA13) are provided for four bit lines (BL00 to BL03 and BL10 to BL13, . . . , and BL0C to BL0F and BL1C to BL1F).

Four the four global bit lines GBL0 to GBL3 connecting outputs of the four local sense amplifiers (LSA00 and LSA10 to LSA01 and LSA11) corresponding to each of the sectors SCT0 and SCT1, the global sense amplifier GBSA is provided.

The configuration of FIG. 2 is just an example. The number of sectors, the number of bit lines included in each of the sectors, the number of local bit lines for a local sense amplifier, the number of global bit lines for the global sense amplifier, and the like may be variously changed.

Figure 3:
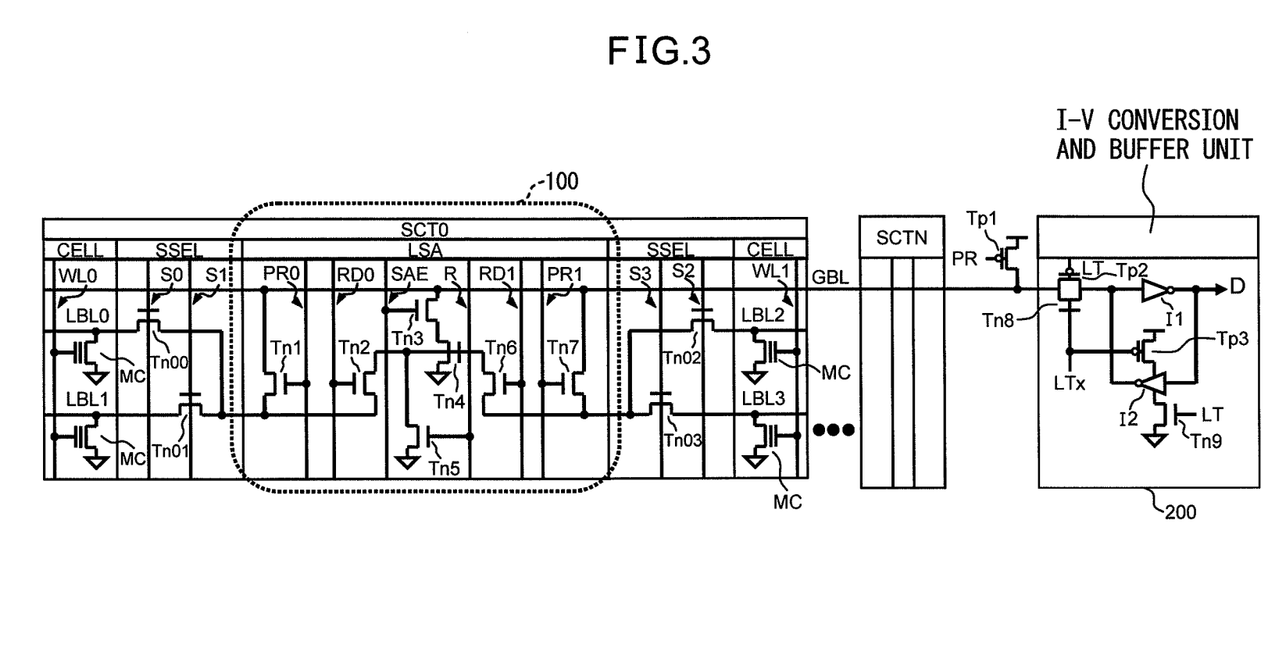
FIG. 3 is a diagram illustrating an example of a local sense amplifier of a related art.

FIG. 3 is a diagram illustrating an example of a local sense amplifier of a related art. FIG. 3 illustrates the details of a sector (SCT0) in a plurality (N+1 pieces) of sectors SCT0 to SECN, a global bit line GBL, and an I-V conversion and buffer unit 200 to which the global bit line GBL is connected.

In the example illustrated in FIG. 3, the local sense amplifier LSA is disposed in the center of the sector SCT0, and selection gates SSEL for selecting a local bit line LBL and cell arrays CELL are disposed on the right and left sides of the local sense amplifier LSA.

The nonvolatile semiconductor memory device as an object of the embodiment is not limited to a nonvolatile semiconductor memory device having a local sense amplifier disposed in the center of a sector as illustrated in FIG. 3 but may be a nonvolatile semiconductor memory device having a local sense amplifier which is disposed, for example, at an end of a sector or between a cell array of a sector and a cell array of the adjacent sector.

As illustrated in FIG. 3, a local sense amplifier (LSA) 100 has a plurality of switch elements (n-channel-type MOS transistors) Tn00 to Tn03 and Tn1 to Tn7.

Local bit lines LBL0 and LBL1 are coupled to the global bit line GBL via the transistors Tn00 and Tn01 controlled by local bit line selection signals S0 and S1 and the transistor Tn1 controlled by a precharge/write signal PR0.

Local bit lines LBL2 and LBL3 are coupled to the global bit line GBL via the transistors Tn02 and Tn03 controlled by local bit line selection signals S2 and S3 and the transistor Tn7 controlled by a precharge/write signal PR1.

Although only two word lines WL0 and WL1 and two memory cells MC are drawn in each of the cell arrays CELL in FIG. 3, actually, a memory cell is provided at each of crossing points of a plurality of bit lines and a plurality of local bit lines. Therefore, in each of the selection gates SSEL, the number of transistors controlled by the local bit line selection signals is set in correspondence with the number of local bit lines.

The transistors Tn2 and Tn6 are provided to select one of the right and left memory cell arrays at the time of reading and verification by cell array selection signals RD0 and RD1. The transistors Tn3 to Tn5 are provided to perform predetermined control by a sense amplifier enable signal SAE, a reset signal R, or the like.

Specifically, the transistor Tn5 receives the signal R and, at the time of standby, clamps the local bit line LBL at a low-potential power supply level Vss, and the transistor Tn3 receives the signal SAE and connects the global bit line GBL to the drain of the transistor Tn4. To the gate of the transistor Tn4, the voltage of the selected local bit line (LBL0) is applied.

To select one local bit line from the right and left memory cell arrays SSEL, the local bit line selection signals S0 to S3 and the cell array selection signals RD0 and RD1 are used. To the gate (control gate) of each of the memory cells MC, any of word lines WL0 to WL3 is connected.

For the global bit line GBL, a p-channel-type MOS transistor Tp1 controlled by a precharge control signal PR is provided. That is, the precharge control signal RP becomes "H" at the trailing edge of the precharge/write signal PR0 and becomes "L" when reading of the inside completes.

In a period other than the period in which the precharge control signal PR is "H", the global bit line GBL is precharged. The global bit line GBL is connected to the I-V conversion and buffer unit 200 from which latched data D is output.

As illustrated in FIG. 3, the I-V conversion and buffer unit 200 has transistors Tn8, Tn9, Tp2, and Tp3, and inverters I1 and I2. The transistors Tn8 and Tp2 form a transfer gate controlled by latch signals LT and LTx, and the inverters I1 and I2 form a latch.

The transistors Tp3 and Tn9 are inserted on the high-potential power supply line side and the low-potential power supply line side, and the operation is controlled according to the latch signals LT and LTx.

When the latch signal LT is at "H" (LTx is at "L"), transfer gates (Tp2 and Tn8) are turned on, the latches (I1 and I2) become enabled, and the level of the global bit line GBL is maintained.

Figure 4:
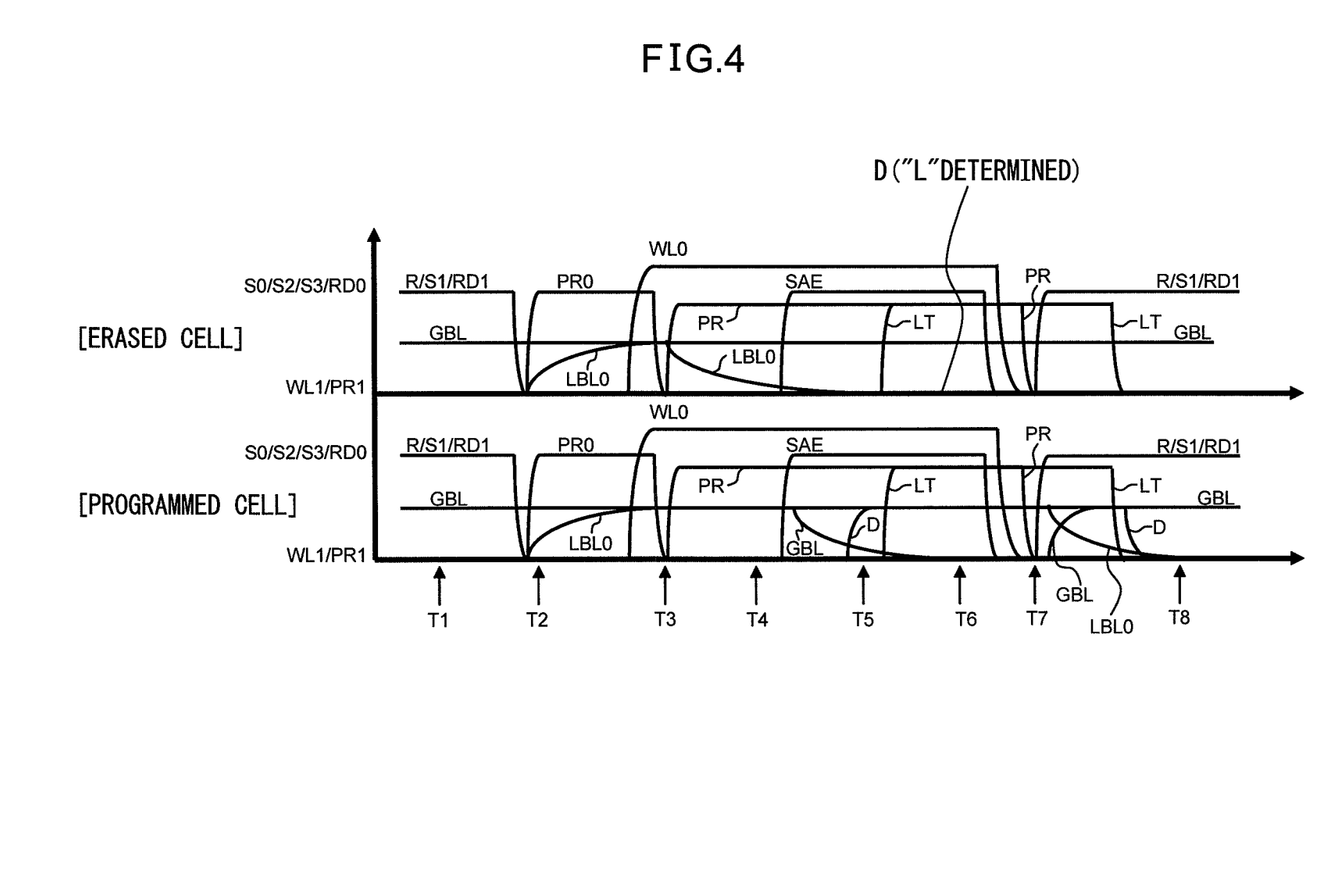
FIG. 4 is a diagram illustrating an example of the operation waveform of the local sense amplifier illustrated in FIG. 3.

FIG. 4 is a diagram illustrating an example of the operation waveform of the local sense amplifier illustrated in FIG. 3 and illustrates the case of reading a cell selected by a word line WL0 and a local bit line LBL0. In FIG. 4, the upper half illustrates the operation waveform of erased cells (erased cells having low threshold voltage), and the lower half illustrates the operation waveform of programmed cells (programmed cells having high threshold voltage).

First, as illustrated by reference numeral T1 in FIG. 4, in the standby state, all of the signals R, S0 to S3, RD0, and RD1 are at "H", and all of the local bit lines LBL0 to LBL3 are clamped at Vss by the reset transistor (Tn4).

This operation is performed to prevent occurrence of word line coupling noise at the time of selecting one local bit line (LBL0) after that, setting the line in an H floating state, and reading the level, by clamping the adjacent local bit line (LBL1) at Vss. At this time, since the precharge control signal PR is set to "H" and the transistor Tp1 is turned on, the global bit line GBL is precharged to "H".

Next, as illustrated by reference numeral T2, the reset signal R, the right-side cell array selection signal RD1, and the local bit line selection signal S1 for selecting a not-selected local bit line LBL1 are changed from "H" to "L". By the operation, only the local bit line LBL0 may be connected to the local sense amplifier LSA.

After that, by changing the precharge/write signal PR0 on the left side to "H", the local bit line LBL0 to be selected is connected to the global bit line GBL, and LBL0 is precharged to "H" via the GBL. In parallel, the word line WL0 to be selected is changed from "L" to "H".

Further, as indicated by reference numeral T3, the signal PR0 is changed from "H" to "L" and, simultaneously, the signal PR is changed from "L" to "H", thereby finishing the precharging of GBL and also finishing the precharging of LBL0.

Specifically, GBL and LBL0 are set to the high impedance state (H floating state) at the "H" level. Since the word line WL0 is "H" at this time, the level of the local bit line LBL0 changes according to the level of the threshold voltage of the memory cell MC.

Therefore, as illustrated by reference numeral T4, in an erasure cell in the upper half of FIG. 4, the threshold voltage of the memory cell MC is low, cell current flows, and the level of LBL0 is decreased to "L" (Vss). On the other hand, in a program cell in the lower half of FIG. 4, the threshold voltage of the memory cell MC is high, so that the cell current hardly flows, and the level of LBL0 maintains in the H floating state ("H" level).

In the case of reading the erasure cell, at a timing when the voltage decreases to the degree that the level of LBL0 may be determined as "L", the sense amplifier enable signal SAE is increased from "L" to "H". In the case of reading the erasure cell, since the transistor Tn4 to which the voltage ("L") of LBL0 is applied to its gate is off, GBL maintains the H floating state.

In response to the above, as illustrated by reference numeral T5, in the erasure cell in the upper half of FIG. 4, the data D buffered in the I-V conversion and buffer unit 200 maintains the "L" level.

On the other hand, in the program cell in the lower half of FIG. 4, LBL0 maintains the H floating state ("H"), so that the voltage of GBL is decreased toward Vss. In response to it, the data D buffered in the I-V conversion and buffer unit 200 changes from "L" to "H". That is, the data obtained by inverting the level of LBL is transmitted to GBL by the local sense amplifier LSA.

After the data D is determined, the latch signal LT is changed from "L" to "H" (LTx is changed from "H" to "L"), the transfer gates (Tp2 and Tn8) provided at the input of the I-V conversion and buffer unit 200 are opened, and the data is latched by the inverters I1 and I2.

The data latching has to be performed to prevent a case such that when the erasure cell whose threshold voltage is relatively high after erasure is read and the sense amplifier enable signal SAE is set to "H" before LBL0 becomes completely "L", GBL is decreased slightly, and the cell is erroneously determined as a program cell.

That is, as illustrated by reference numeral T6, the level of GBL is latched and, after that, the data D in the erasure cell is determined as "L", and the data D in the program cell is determined as "H".

As indicated by reference numeral T7, after the data D is latched (determined), the work line WL0 is reset to "L", the local bit line LBL0 is reset to "L", and the global bit line GBL is reset to "H". As a result, as illustrated by reference numeral T8, the state returns to the initial state (standby state T1).

Figure 5:
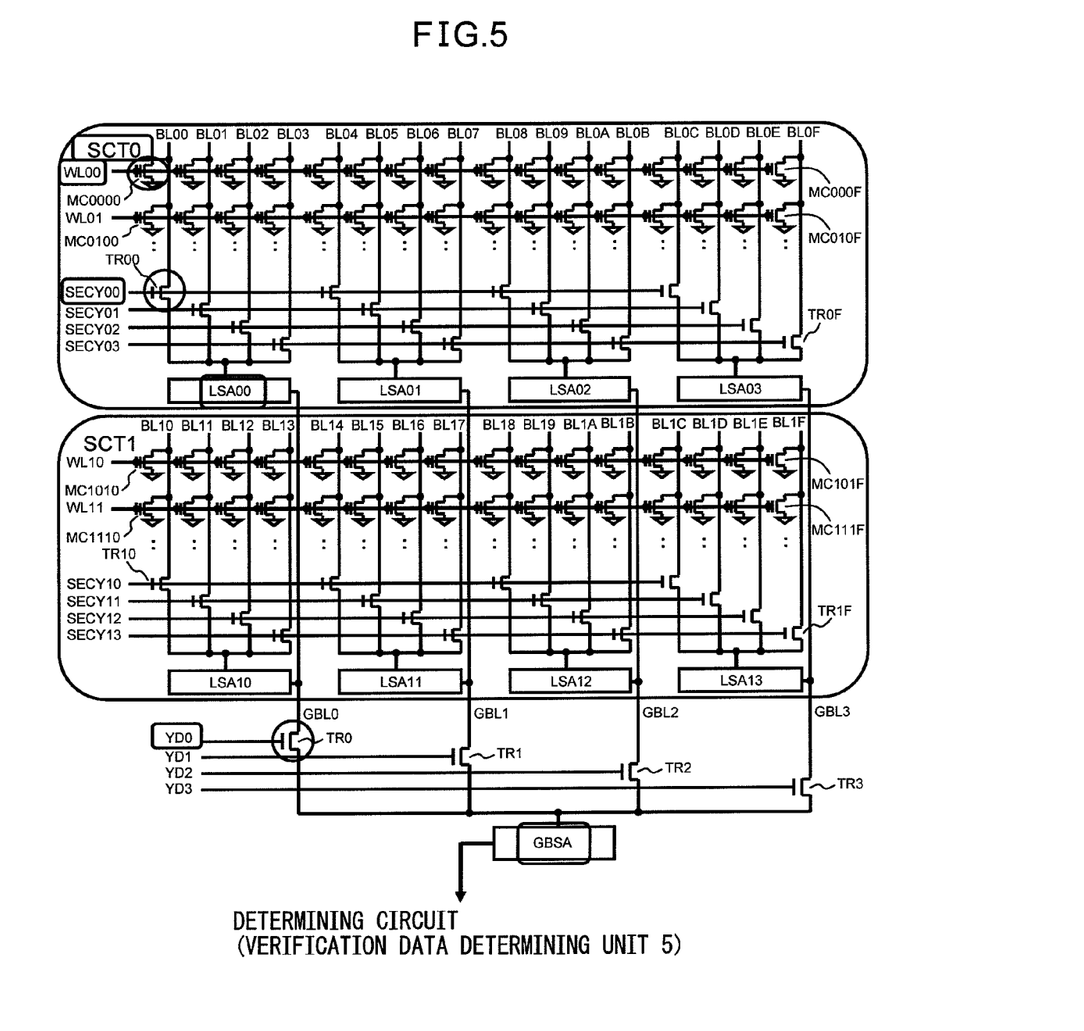
FIG. 5 is a diagram for explaining the operation of a nonvolatile semiconductor memory device of a related art.

FIG. 5 is a diagram for explaining the operation of a nonvolatile semiconductor memory device of a related art and schematically illustrating a main part corresponding to FIG. 2 described above in order to explain verifying operation. As illustrated in FIG. 5, after entering a verification mode, for example, the word line WL00 in the sector SCT0 and the selection signals SECY00 and YD0 are set to the high level "H" to select one memory cell.

Specifically, the switching transistor TR00 is turned on by the selection signal SECY00, the local sense amplifier LSA00 is activated (turned on) and, further, the switching transistor Tr0 is turned on by the selection signal YD0. By turning on the global sense amplifier GBSA, the memory cell MC0000 at the crossing point of the word line WL00 and the local bit line BL00 is selected.

The data in the memory cell MC0000 is detected (read) by the global sense amplifier GBSA via the local bit line BL00, the switching transistor TR00, the local sense amplifier LSA00, the global bit line GBL0, and the switching transistor TR0.

The data of the memory cell MC0000 read by the global sense amplifier GBSA is verified by a data determining unit (verification data determining unit 5).

That is, after one memory cell (MC0000) is selected, a word line voltage for verification is generated and transmitted to the word line (WL00). After that, as described with reference to FIG. 4, the local sense amplifier (LSA00) is operated to perform verifying operation. The operations of erasure and program verification are the same except for the word line voltages.

As described above, for example, in a flash memory using a memory cell whose threshold voltage decreases when data is erased, erase verification is performed address by address in a manner similar to reading operation. Consequently, even when a plurality of sectors are erased in a lump, the time for verification is long, so that the effect of batch erasure is reduced.

Figure 6:
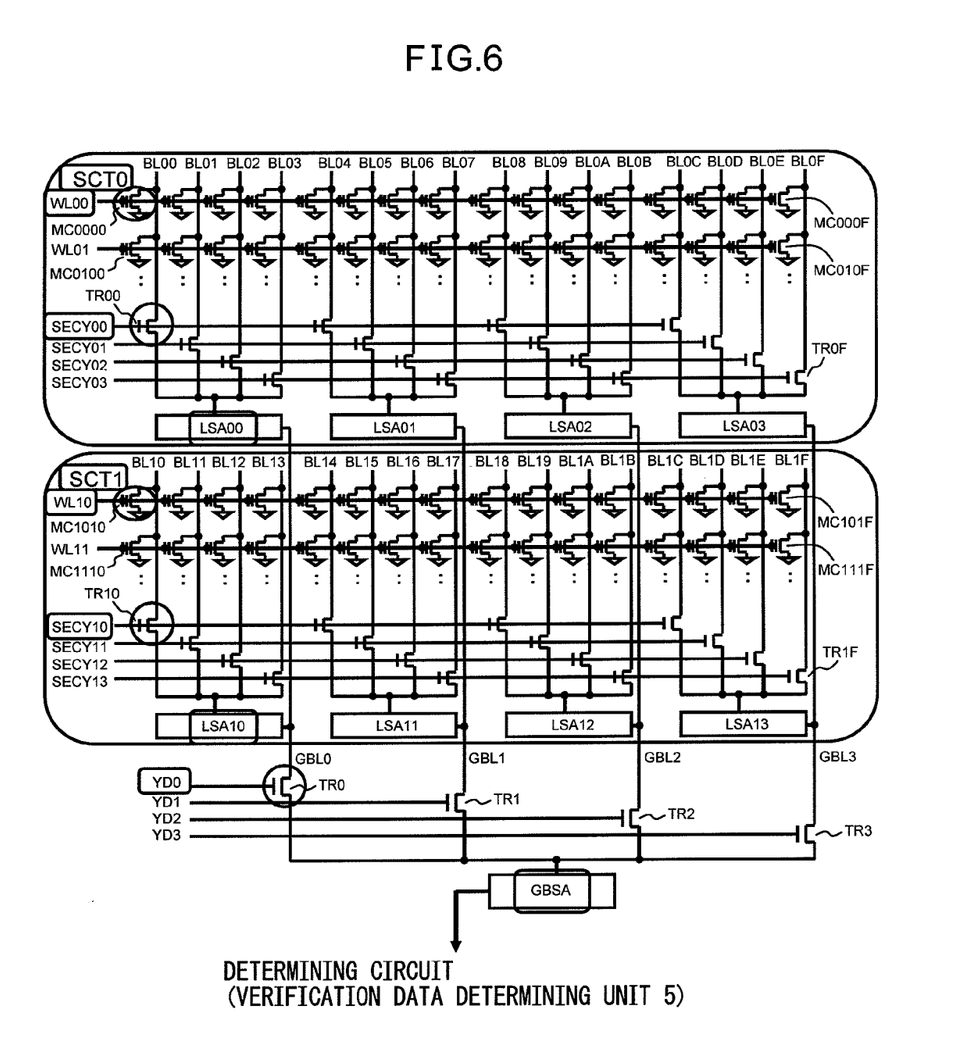
FIG. 6 is a diagram for explaining the operation at the time of erase verification in a nonvolatile semiconductor memory device according to an embodiment.

Hereinafter, embodiments of the nonvolatile semiconductor memory device and its verification control method will be described in detail with reference to the appended drawings. FIG. 6 is a diagram for explaining the operation at the time of erase verification in the nonvolatile semiconductor memory device (flash memory) according to an embodiment.

As illustrated in FIG. 6, in the erase verification in the flash memory in the embodiment, in each of the sectors SCT0 and SCT1, the word line WL00 or WL01, the selection signal SECY00 or SECY10, and the selection signal YD0 are set to the high level "H" to select one memory cell.

That is, the switching transistors TR00 and TR10 are turned on and the local sense amplifiers LSA00 and LSA01 are turned on by the selection signals SECY00 and SECY10 and, further, the switching transistor TR0 is turned on by the selection signal YD0. The global sense amplifier GBSA is turned on.

By the operation, the memory cell MC0000 at the cross point of the word line WL00 and the local bit line BL00 in SCT0 and the memory cell MC1010 at the cross point of the word line WL10 and the local bit line BL10 in SCT1 are selected.

The data in the memory cell MC0000 is read by the global sense amplifier GBSA via the local bit line BL00, the switching transistor TR00, the local sense amplifier LSA00, the global bit line GBL0, and the switching transistor TR0.

Simultaneously, the data in the memory cell MC1010 is read by the global sense amplifier GBSA via the local bit line BL10, the switching transistor TR10, the local sense amplifier LSA10, the global bit line GBL0, and the switching transistor TR0.

Therefore, in the sectors SCT0 and SCT1, the data in the plurality of memory cells MC0000 and MC1010 corresponding to the same position is read by GBSA. For example, when the threshold voltage of all of cells in a plurality of memory cells in an erased state corresponding to the same position is low, data output from GBSA has the "L" level.

On the other hand, for example, if there is even one cell having high threshold voltage in the plurality of memory cells in the erased state corresponding to the same position, data output from GBSA has the "H" level. Consequently, in the flash memory of the embodiment, for example, by simultaneously performing erase verification on a plurality of memory cells corresponding to the same position in a plurality of sectors, time for the erase verification is reduced.

As illustrated in FIG. 6, after entering the erase verification mode, the word line WL00 and the selection signal SECY00 in the sector SCT0 and the word line WL10 and the selection signal SECY10 in the sector SCT1 are set to "H" to select one memory cell MC0000 in the sector SCT0 and one memory cell MC1010 in the sector SCT1.

Although only two sectors SCT0 and SCT1 are drawn in FIG. 6, the number of sectors is not limited, and one memory cell each may be selected simultaneously in a plurality of sectors.

After selecting the memory cells as described above, a word line voltage for erase verification is generated and transmitted to the selection word lines WL00 and WL10. After that, the local sense amplifiers LSA00 and LSA10 in the sectors SCT0 and SCT1 are operated as described with reference to FIG. 3 and FIG. 4.

By inputting a signal obtained by performing wired-OR on outputs of the local sense amplifiers LSA00 and LSA10 to the global sense amplifier GBSA, the erase verification may be simultaneously performed on a plurality of memory cells.

When a memory cell which is not erased exists, an output of the local sense amplifier of the sector in which the memory cell exists has the "L" level. That is, as described with reference to FIG. 3 and FIG. 4, since the local sense amplifier LSA may not change its output "L" to "H" after precharging, the selected global bit line GBL becomes "L", and the erase verification fails.

On the other hand, when all of selected memory cells are erased, outputs of all of the local sense amplifiers LSA00 and LSA10 maintain the H floating state of the precharge level, so that the global bit line GBL maintains the "H" level, and the erase verification succeeds.

That is, in the case of performing the erase verification on a memory cell MC whose threshold voltage becomes low when data is erased and in which cell current increases, cell data is inverted by the local sense amplifiers LSA00 and LSA10 disposed near the memory cell in the sectors SCT0 and SCT1.

Further, the data inverted by the local sense amplifiers LSA00 and LSA10 is subjected to wired-OR in the global sense amplifier GBSA, thereby performing the erase verification. By simultaneously verifying a plurality of memory cells in such a manner, although not all of memory cells, the verification time may be shortened.

Although the erase verification on the flash memory using a memory cell whose threshold voltage decreases when data is erased has been described as an example, program verification on a flash memory using a memory cell whose threshold voltage decreases when data is programmed is similar to the above.

Figure 7:
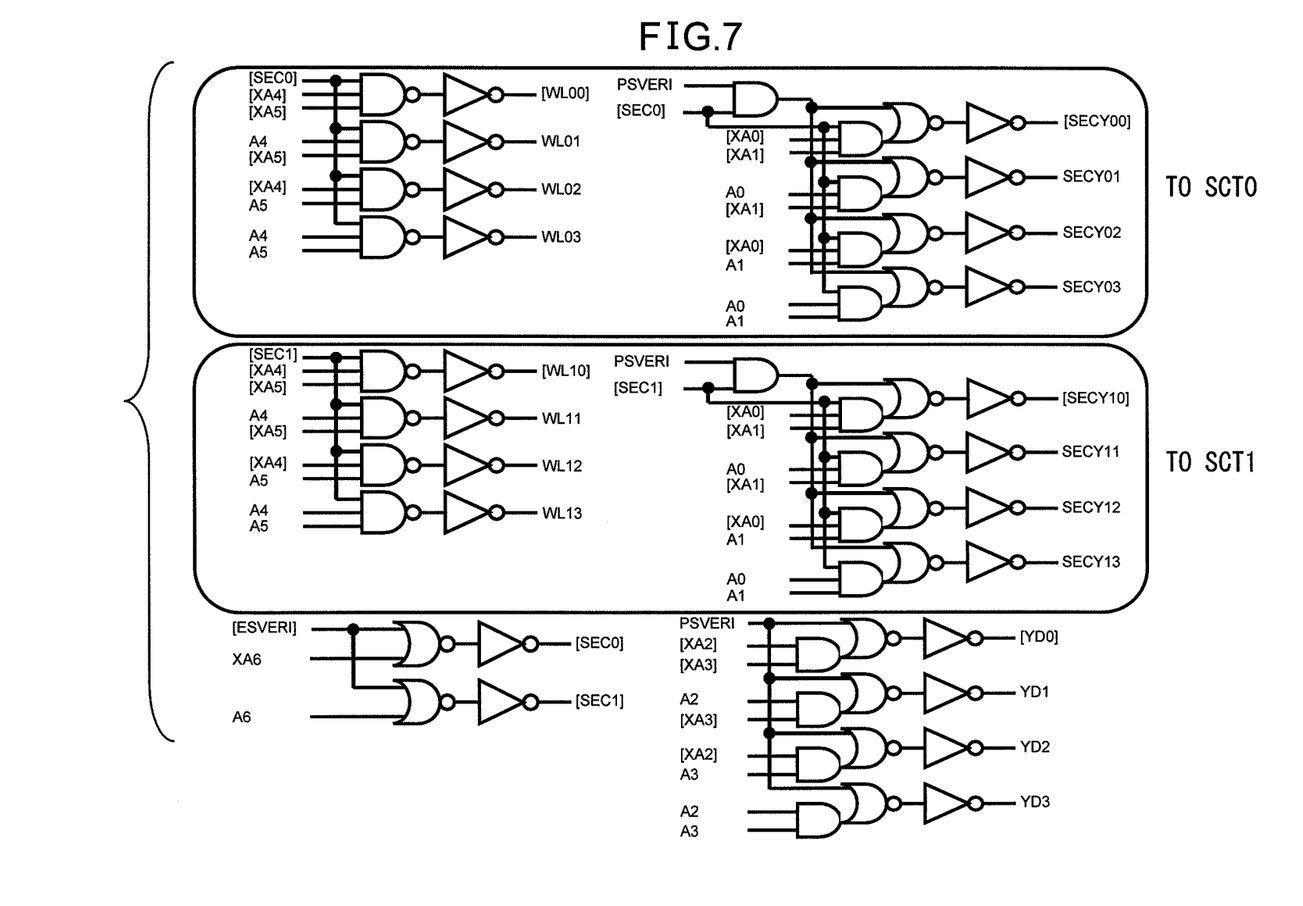
FIG. 7 is a diagram for explaining the operation of an address decoder at the time of the erase verification illustrated in FIG. 6.

FIG. 7 is a diagram for explaining the operation of the address decoder at the time of the erase verification illustrated in FIG. 6. Although FIG. 7 illustrates an example of a control signal generator for generating a control signal to execute the erase verification function included in the address decoder 3, various circuit configurations may be employed.

As illustrated in FIG. 7, when a signal ESVERI indicative of erasure batch verification becomes "H", both of the signals SEC0 and SEC1 for selecting the sectors SCT0 and SCT1 become the "H" level regardless of an input address.

Further, according to the input address, the levels of the word lines WL00 and WL10 become "H", the selection signals SECY00 and SECY10 become the "H" level, and the selection signal YD0 becomes the "H" level. Thus, the erase verification connection relations of FIG. 6 are achieved.

In the erase verification, by inverting data of a memory cell by using the local sense amplifier, a plurality of memory cells may be verified simultaneously, and time for the erase verification may be shortened.

Figure 8:
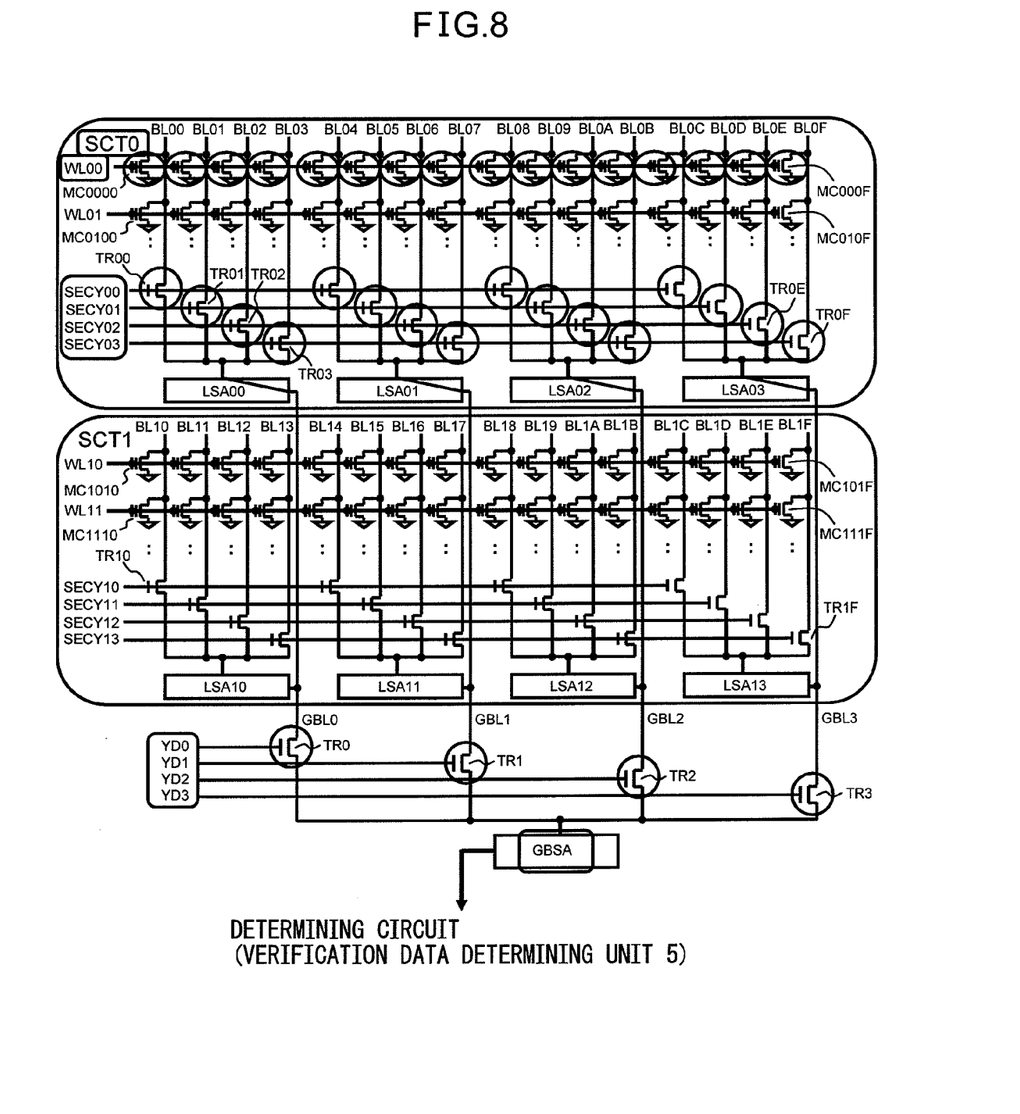
FIG. 8 is a diagram for explaining the operation at the time of program verification in the nonvolatile semiconductor memory device according to the embodiment.

FIG. 8 is a diagram for explaining the operation at the time of program verification in the nonvolatile semiconductor memory device according to the embodiment.

As illustrated in FIG. 8, after entering a program verification mode, the word line WL00 and the selection signals SECY00 to SECY03 in the sector SCT0 and selection signals YD0 to YD3 are set to "H". Inputs of the local sense amplifiers LSA00 to LSA03 in the sector SCT0 are directly coupled to outputs.

Although one word line WL00 is selected in the sector SCT0 in FIG. 8, the number of word lines selected is not limited, and a plurality of word lines may be selected simultaneously. In the case of selecting a plurality of word lines in sectors, however, corresponding selection signals SECYxx have to be set to "H".

After selecting a memory cell in such a manner, a word line voltage for program verification is generated and transmitted to the selection word line WL00.

By inputting a signal obtained by performing wired-OR on outputs of the local sense amplifiers LSA00 and LSA03 to the global sense amplifier GBSA, the program verification may be simultaneously performed on a plurality of memory cells.

When a memory cell which is not programmed exists, an output of the local sense amplifier of the sector in which the memory cell exists has the "L" level. That is, since the input and output of the local sense amplifier LSA are directly connected, if a memory cell which is not programmed exists, the output "L" is directly transmitted to the global bit line GBL, and program verification fails.

On the other hand, when all of selected memory cells are programmed, outputs of all of the local sense amplifiers LSA00 and LSA10 maintain the H floating state of the precharge level, so that the global bit line GBL maintains the "H" level, and the program verification succeeds.

That is, in the case of performing program verification on a memory cell MC whose threshold voltage becomes high when programmed, wired-OR is performed on data which passes the local sense amplifier LSA at the same level by the global sense amplifier GBSA. By simultaneously verifying, though not all of memory cells, a plurality of memory cells in such a manner, the verification time may be shortened.

However, since data is inverted from that in the normal program verification, for example, an expectation value in the case of performing verification has to be inverted in a state machine (the rewriting state machine and test control circuit 2).

Although the program verification on the flash memory using a memory cell whose threshold voltage decreases when data is erased has been described as an example, erase verification on a flash memory using a memory cell whose threshold voltage decreases when data is programmed is similar to the above.

Figure 9:
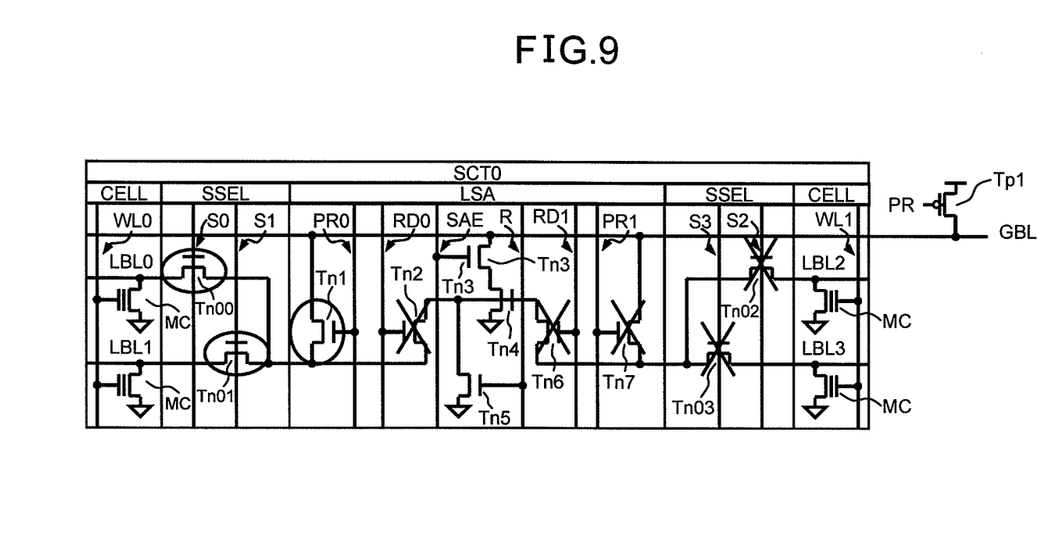
FIG. 9 is a diagram for explaining the operation of a local sense amplifier at the time of the program verification illustrated in FIG. 8.

FIG. 9 is a diagram for explaining the operation of a local sense amplifier at the time of the program verification illustrated in FIG. 8.

As described above, in the case of performing the program verification, inputs of the local sense amplifiers LSA00 to LSA03 in the selected sector SCT0 are directly coupled to outputs of the local sense amplifiers LSA00 to LSA03. That is, as illustrated in FIG. 9, in the local sense amplifier LSA, the switching elements (transistors) Tn00, Tn01, and Tn1 are turned on, and the transistors Tn02, Tn03, Tn2, Tn6, and Tn7 are turned off.

By the operation, the selected local bit lines LBL0 and LBL1 are connected to the global bit line GBL via the transistors Tn00, Tn01, and Tn1. LBL0 and LBL1 in FIG. 9 correspond to BL00 to BL0F in FIG. 8, the transistors Tn00 and Tn01 in FIG. 9 correspond to TR00 to TR0F in FIG. 8, and Tn1 in FIG. 9 corresponds to TR0 to TR3 in FIG. 8.

That is, the signal RD0 is set to "L", the signals PR0, S0, and S1 are set to "H", and GBL and LBL0 and LBL1 are directly coupled. After that, the signal PR is set to "H", and the transistor Tp1 for precharging is turned off.

Since the word line WL0 is "H" at this time, even there is one cell which is not programmed (erased) in the memory cells MC connected to the word line WL0, an output of the local sense amplifier in the sector in which the cell exists becomes "L".

As described above, since the local sense amplifier LSA may not change "L" to "H" after precharging, the selected global bit line GBL becomes "L", and the program verification fails.

On the other hand, when all of the memory cells connected to the word line WL0 are programmed, outputs of all of the local sense amplifiers LSA00 to LSA03 maintain the H floating state of the precharge level, so that the global bit line GBL maintains the "H" level, and the program verification succeeds.

In such a manner, the program verification may be performed simultaneously on a plurality of memory cells. However, since data is inverted from that in the normal program verification, as described above, an expectation value in the case of performing verification has to be inverted in a state machine.

Figure 10:
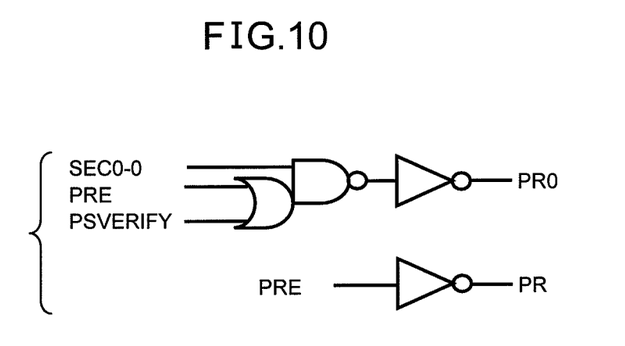
FIG. 10 is a diagram illustrating an example of a control signal generating circuit for making the operation of the local sense amplifier illustrated in FIG. 9 operate.

FIG. 10 is a diagram illustrating an example of a control signal generating circuit for making the operation of the local sense amplifier illustrated in FIG. 9 operate. The control signal generating circuit (control signal generator) illustrated in FIG. 10 is included in, for example, the address decoder 3. The circuit configuration is not limited to that illustrated in FIG. 10 but may be variously changed.

FIG. 10 illustrates an example of a control signal generating circuit for directly connecting input and output of the local sense amplifier LSA as illustrated in FIG. 9, in other words, for directly connecting the local bit line LBL connected to LSA and the global bit line GBL.

In FIG. 10, reference numeral SEC0-0 indicates an S0/S1 region selection signal of the sector SCT0, PRE denotes a precharge timing signal, and PEVERIFY denotes a batch program verification period signal. When the signal PEVERIFY is at the "H" level, the signal PR0 becomes "H", and LBL and GBL are directly connected to each other.

Figure 11:
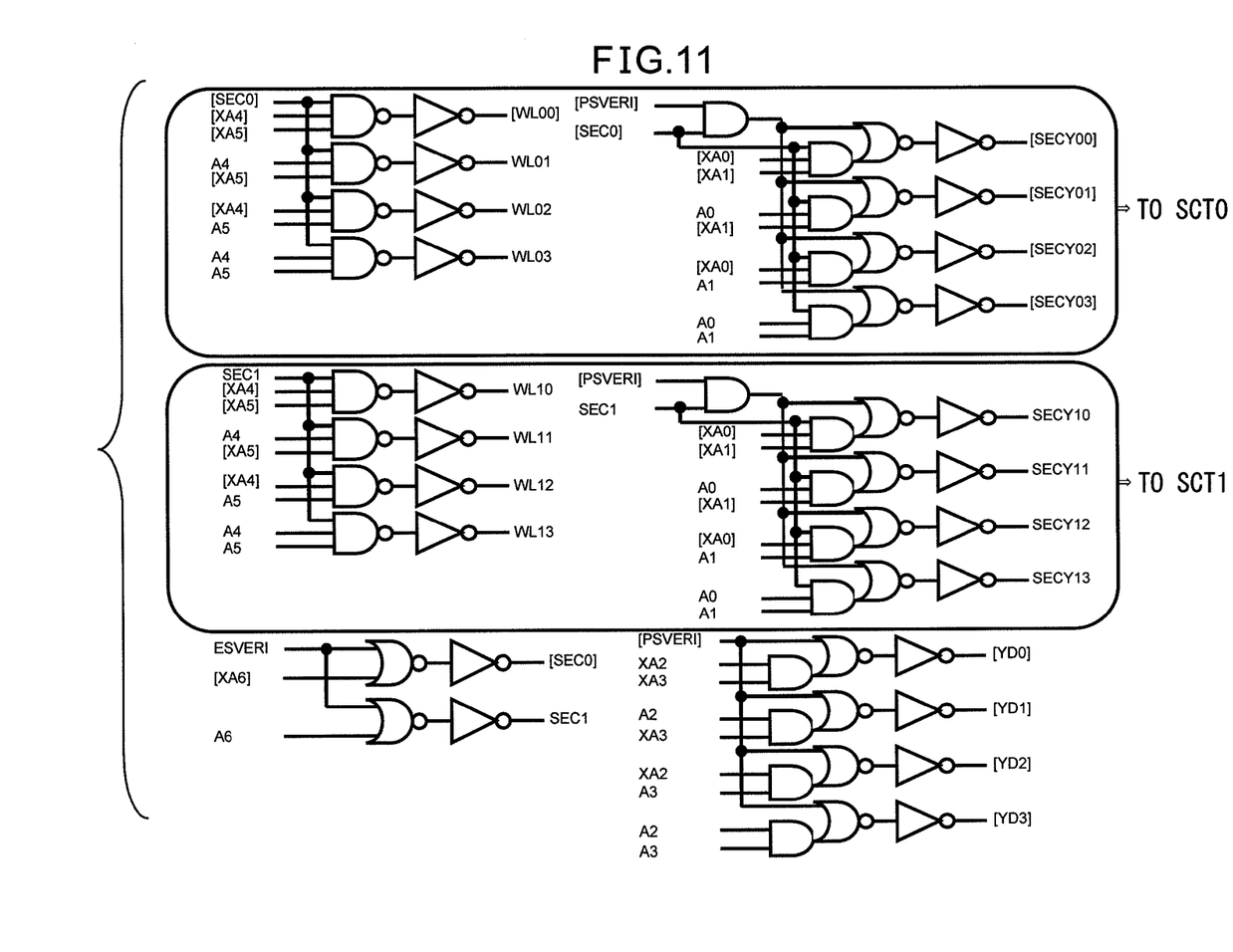
FIG. 11 is a diagram for explaining the operation of an address decoder at the time of the program verification illustrated in FIG. 8.

FIG. 11 is a diagram for explaining the operation of an address decoder at the time of the program verification illustrated in FIG. 8. Although FIG. 11 illustrates an example of a control signal generator generating a control signal for executing the program verification function included in the address decoder 3, obviously, various circuit configurations are possible.

As illustrated in FIG. 11, when PSVERI indicative of program batch verification becomes the "H" level, all of the signals YD0 to YD3 selecting the global bit lines GBL0 to GBL3 become the "H" level regardless of an input address. Consequently, all of the global bit lines GBL0 to GBL3 are connected to the global sense amplifier GBSA.

All of the signals SECY00 to SECY03 selecting the local bit lines BL00 to BL0F in the selected sector SCT0 become the "H" level regardless of an input address, and all of the bit lines BL00 to BL0F in the sector SCT0 are connected to the local sense amplifiers LSA00 to LSA03.

In FIG. 11, for example, by also setting the signal ESVERI to the "H" level, WL10 and SECY10 to SECY13 become the "H" level, and all of memory cells connected to WL00 and WL10 may be simultaneously verified.

Further, in FIG. 11, by making a decoder for a word line WLxx have the same configuration as that of a decoder for SECYxx, all of word lines may be selected.

As described above, in the program verification, by directly connecting the local bit line to the global bit line without using the local sense amplifier, a plurality of memory cells may be simultaneously verified, and time for the program verification may be shortened.

The erase verification and program verification in the nonvolatile semiconductor memory device using a memory cell whose threshold voltage becomes low when data is erased has been mainly described. Application of the embodiment is not limited to such a memory cell whose threshold voltage becomes low when data is erased. The embodiment may be also applied to a nonvolatile semiconductor memory device using a memory cell whose threshold voltage becomes high when data is erased.

That is, in the case of applying the embodiment to a nonvolatile semiconductor memory device using a memory cell whose threshold voltage becomes high when data is erased, FIG. 5 to FIG. 7 may be applied for the program verification, and FIG. 8 to FIG. 11 may be applied for the erase verification.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile semiconductor memory device comprising:
a memory cell array including a plurality of electrically-rewritable memory cells each connected to a word line and a local bit line;
a plurality of local sense amplifiers connected to the local bit lines, the plurality of local sense amplifiers being configured to invert data of the memory cells, respectively, and to output the inverted data to a global bit line;
a global sense amplifier configured to compute a logical sum of outputs of the plurality of local sense amplifiers; and
an address decoder configured to switch between a first verification and a second verification, the first verification causing the plurality of local sense amplifiers to operate and causing data of a first subset of the plurality of memory cells connected to the plurality of local sense amplifiers to be verified simultaneously, the second verification causing the plurality of local sense amplifiers to stop, causing the local bit lines connected to at least one of the local sense amplifiers to be directly connected with the global bit line, and causing data of a second subset of the plurality of memory cells connected to the at least one of the local sense amplifiers to be verified simultaneously.

2. The nonvolatile semiconductor memory device as claimed in claim 1, wherein:
the memory cell array includes a plurality of sectors, the address decoder receives an input address and a control signal indicative of execution of the first verification or the second verification, and
when the control signal indicates execution of the first verification, the address decoder selects the plurality of sectors and selects the plurality of word lines from each of the selected plurality of sectors via a row decoder based on the input address, to select a plurality of memory cells from the plurality of sectors.

3. The nonvolatile semiconductor memory device as claimed in claim 2, wherein when the control signal indicates execution of the second verification, the address decoder selects at least one word line via the row decoder, selects the plurality of local bit lines via a column decoder, and selects a plurality of memory cells connected to the at least one word line selected.

4. The nonvolatile semiconductor memory device as claimed in claim 3, wherein:
the local sense amplifier includes a first terminal to which the local bit line is connected, a second terminal to which the global bit line is connected, and a switch connecting the first and second terminals and,
when the control signal indicates execution of the second verification, the switch is performed.

5. The nonvolatile semiconductor memory device as claimed in claim 1, wherein each of the memory cells is a memory cell in which, when data is erased, a threshold voltage of a transistor as a component of the memory cell becomes lower than a threshold voltage of the transistor in a data non-erase state.

6. The nonvolatile semiconductor memory device as claimed in claim 5, wherein the first verification is an erase verification of simultaneously verifying data in the plurality of memory cells erased, and the second verification is a program verification of simultaneously verifying data of the plurality of memory cells programmed.

7. The nonvolatile semiconductor memory device as claimed in claim 6, wherein the erase verification is to simultaneously verify a plurality of memory cells corresponding to the same position as in the plurality of sectors.

8. The nonvolatile semiconductor memory device as claimed in claim 7, wherein a plurality of memory cells corresponding to the same position in the plurality of sectors are memory cells each including a common address subsequent to a sector address.

9. The nonvolatile semiconductor memory device as claimed in claim 6, wherein the program verification is to simultaneously verify a plurality of memory cells included in one sector of the plurality of sectors.

10. The nonvolatile semiconductor memory device as claimed in claim 9, wherein the program verification is to simultaneously verify a plurality of memory cells connected to one word line in the one sector.

11. A verification control method for a nonvolatile semiconductor memory device comprising:
- a memory cell array including a plurality of electrically-rewritable memory cells each connected to a word line and a local bit line;
- a plurality of local sense amplifiers connected to the local bit lines, the plurality of local sense amplifiers inverting data of the memory cells, respectively, and outputting the inverted data to a global bit line; and
- a global sense amplifier configured to compute a logical sum of outputs of the plurality of local sense amplifiers, wherein the verification control method comprises:
- operating the plurality of local sense amplifiers to simultaneously verify data of a first subset of the plurality of memory cells connected to the plurality of local sense amplifiers; and
- stopping the plurality of local sense amplifiers, directly connecting the local bit lines connected to at least one of the local sense amplifiers with the global bit line, and simultaneously verifying data of a second subset of the plurality of memory cells connected to the at least one of the local sense amplifiers.

* * * * *